(12) United States Patent
Park et al.

(10) Patent No.: US 8,239,064 B2
(45) Date of Patent: Aug. 7, 2012

(54) ROBOT MECHANISM FOR INSPECTION OF LIVE-LINE SUSPENSION INSULATOR STRING

(75) Inventors: Joon-Young Park, Daejeon (KR); Byung-Hak Cho, Daejeon (KR); Jae-Kyung Lee, Daejeon (KR); Ki-Yong Oh, Daejeon (KR)

(73) Assignee: Korea Electric Power Corporation, Seoul (KR)

( * ) Notice: Subject to any disclaimer, the term of this patent is extended or adjusted under 35 U.S.C. 154(b) by 930 days.

(21) Appl. No.: 12/254,014

(22) Filed: Oct. 20, 2008

(65) Prior Publication Data

US 2010/0100239 A1    Apr. 22, 2010

(30) Foreign Application Priority Data

May 31, 2008   (KR) .................. 10-2008-0051302

(51) Int. Cl.
*G05B 15/00* (2006.01)
*G05B 19/00* (2006.01)
(52) U.S. Cl. ...................................... 700/258
(58) Field of Classification Search .............. 700/254, 700/258; 901/50; 324/541, 544, 551; 73/584; 340/647
See application file for complete search history.

(56) References Cited

U.S. PATENT DOCUMENTS

| | | | | |
|---|---|---|---|---|
| 4,871,972 A | * | 10/1989 | Roy et al. | 324/551 |
| 5,181,026 A | * | 1/1993 | Granville | 340/870.28 |
| 5,514,967 A | * | 5/1996 | Zelm | 324/551 |
| 6,518,772 B1 | * | 2/2003 | Milkovic et al. | 324/551 |
| 7,200,889 B2 | * | 4/2007 | Vohra | 15/88.2 |
| 7,797,781 B2 | * | 9/2010 | Park et al. | 15/88.4 |
| 2003/0042913 A1 | * | 3/2003 | Bussinger | 324/541 |
| 2011/0192315 A1 | * | 8/2011 | Phillips et al. | 104/112 |
| 2011/0196534 A1 | * | 8/2011 | Ekes et al. | 700/259 |
| 2011/0196536 A1 | * | 8/2011 | Phillips et al. | 700/259 |

FOREIGN PATENT DOCUMENTS

| | | |
|---|---|---|
| KR | 10-2006 0031245 | 4/2006 |
| KR | 10-0668952 | 1/2007 |
| KR | 10-0691616 | 2/2007 |
| KR | 10-0827787 | 5/2008 |

* cited by examiner

*Primary Examiner* — Khoi Tran
*Assistant Examiner* — Harry Oh
(74) *Attorney, Agent, or Firm* — McDermott Will & Emery LLP

(57) ABSTRACT

Disclosed herein is a robot mechanism for inspection of a live-line suspension insulator string. A robot body of the robot mechanism reciprocates along the live-line suspension insulator string and includes upper and lower robot frames configured to encircle the insulator string, a battery module provided to either end of the robot body, an actuation module for moving the robot body along the insulator string, an inspection module for electrically inspecting an insulator, a connection module for coupling the robot body to an installation/dismantlement mechanism, a wing opening/closing module for manually separating the robot body from the insulator string, a measurement module for measuring electrical properties of the insulator, a controller for controlling operation of the robot body, and a crack detection unit for detecting cracks formed in the insulator.

8 Claims, 19 Drawing Sheets

ROBOT MECHANISM FOR INSPECTION OF LIVE-LINE SUSPENSION INSULATOR STRING

CROSS-REFERENCE TO RELATED APPLICATION

The benefit of priority is claimed to Republic of Korea patent application number 10-2008-0051302 filed May 31, 2008, which is incorporated by reference herein.

BACKGROUND

1. Field of the Invention

The present invention relates to a robot mechanism for inspection of a live-line suspension insulator string, and more particularly to a robot mechanism that can precisely inspect defects of insulators in live-line conditions while moving along a suspension insulator string of a high voltage transmission line.

2. Description of the Related Art

Generally, an insulator is an insulating material used for supporting and connecting an electric line to an electric post or an iron tower. An insulator string is prepared by attaching several insulators on top of another.

Most insulators are made from glass, earthenware, porcelain, and the like, and have metallic components attached thereto by adhesives. Therefore, the insulator is likely to undergo a failure due to salt or dust stained on the surface of the insulator by long term use after installation thereof. Also, the insulator suffers deformation caused by temperature variation, chemical problems relating to acids or alkalis, environmental variations relating to sunlight, and the like.

Insulator strings are generally classified into two kinds of insulator string, i.e. a suspension insulator string and a tension insulator string. These insulator strings are used for ultra-high voltage transmission lines, extra-high voltage distribution lines, electrified railway tracts, low voltage distribution overhead lines, and the like.

Most conventional mechanisms for inspection of insulator strings are applied to the tension insulator string instead of the suspension insulator string. Further, the conventional mechanism for inspection of the tension insulator string is a heavy and large-size manual inspection mechanism which can be manually operated by means of a hot stick, or which can be lowered along the insulator string by the weight of the mechanism and is then lifted again by means of a rope.

In detection of a defective insulator, it is necessary for such a conventional manual inspection mechanism to measure only one property of the insulator. Further, since the insulators are suspended from an electric line through which a high voltage flows, an operator of the conventional manual inspection mechanism is often exposed to dangers and other severe problems.

On the other hand, although not designed for inspection of live-line insulators, there are robots for cleaning the insulators while moving along the live-line insulator string. However, since such a conventional robot employs a mechanism for cleaning upper and lower surfaces of the insulator and includes lots of components, it has a large size and a heavy weight. Furthermore, since the conventional robot is designed to contact two or more insulators in operation, it is not desirable in terms of insulation.

SUMMARY

The present invention is conceived to solve the problems of the conventional techniques as described above, and an aspect of the present invention is to provide a robot mechanism that can precisely inspect an insulator of a suspension insulator string for transmission and/or distribution lines in live-line conditions to detect defects of the insulator.

In accordance with the present invention, the above and other aspects can be accomplished by the provision of a robot mechanism for inspection of a live-line suspension insulator string, including a robot body reciprocating along the live-line suspension insulator string, wherein the robot body includes: upper and lower robot frames configured to encircle the insulator string; a battery module provided to either end of the robot body; an actuation module for moving the robot body along the insulator string; an inspection module for electrically inspecting an insulator; a connection module for coupling the robot body to an installation/dismantlement mechanism; a wing opening/closing module for manually separating the robot body from the insulator string; a measurement module for measuring electrical properties of the insulator; a controller for controlling operation of the robot body; and a crack detection unit for detecting cracks formed in the insulator.

BRIEF DESCRIPTION OF THE DRAWINGS

The above and other aspects, features, and advantages of the present invention will become apparent from the following description of exemplary embodiments given in conjunction with the accompanying drawings, in which.

DETAILED DESCRIPTION

Exemplary embodiments of the present invention will be described in detail with reference to the accompanying drawings hereinafter.

Figure 1:
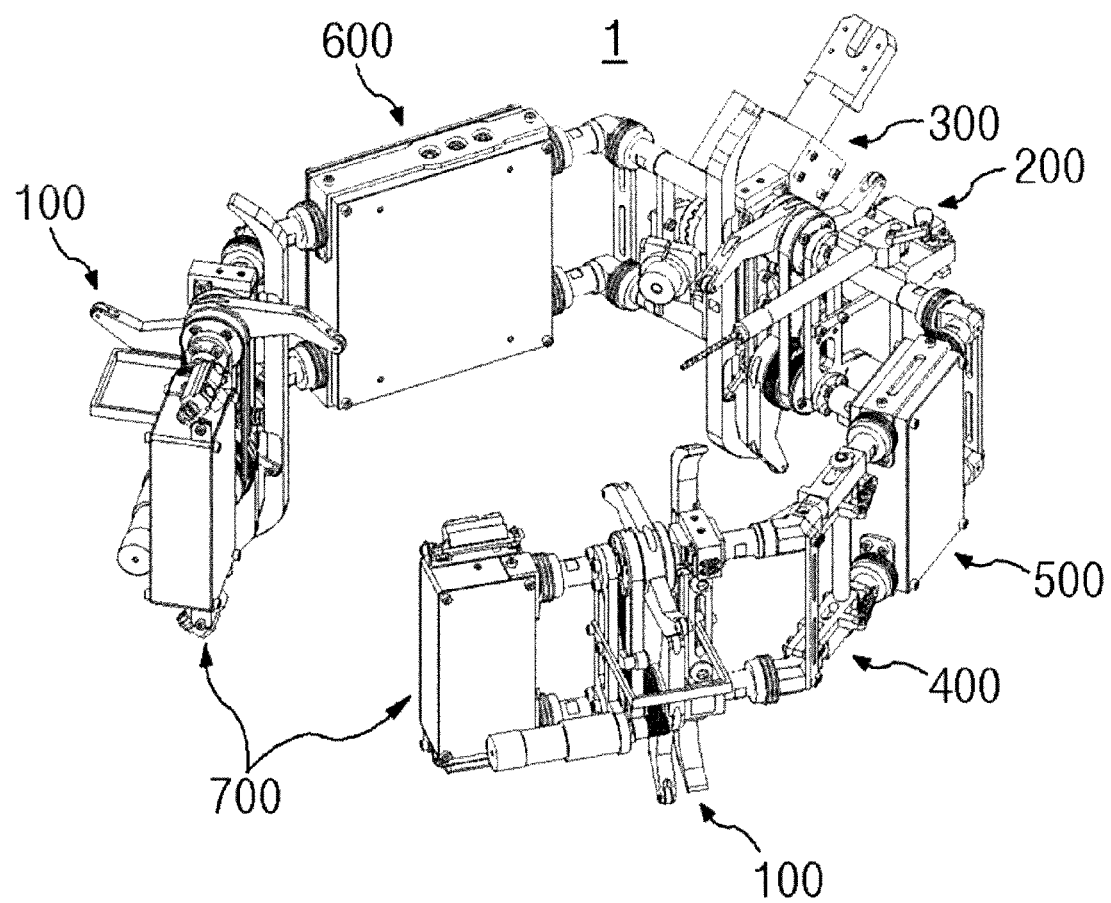
FIG. 1 is a perspective view of a robot mechanism for inspection of a live-line suspension insulator string according to an embodiment of the present invention.
Figure 2:
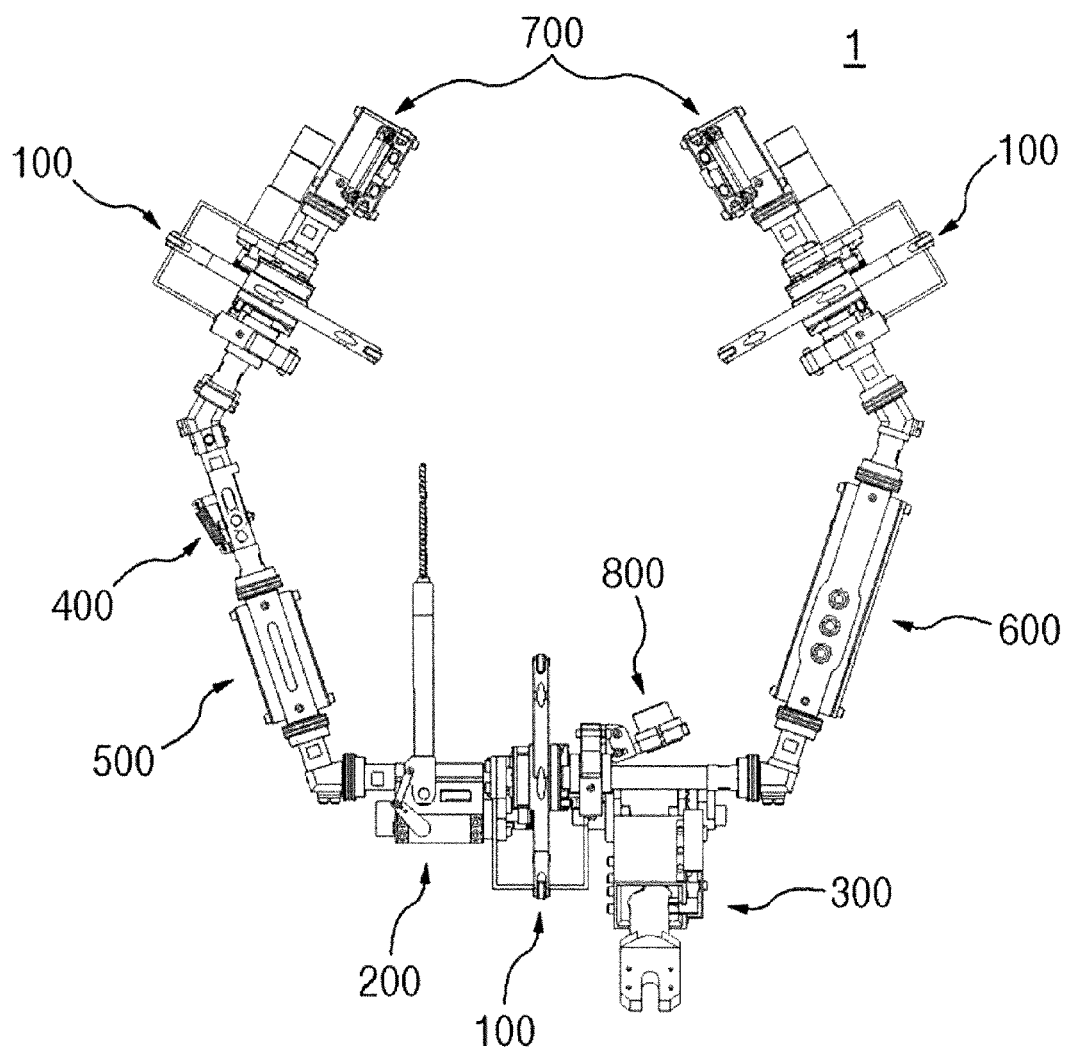
FIG. 2 is a top view of the robot mechanism according to the embodiment of the present invention.

FIG. 1 is a perspective view of a robot mechanism for inspection of a live-line suspension insulator string according to one embodiment of the present invention, and FIG. 2 is a top view of the robot mechanism according to the embodiment of the present invention.

Referring to FIGS. 1 and 2, according to the present invention, a robot body 1 of a robot mechanism for inspection of a live-line suspension insulator string includes an actuation module 100, an inspection module 200, a connection module 300, a wing opening/closing module 400, a measurement module 500, a controller 600, a battery module 700, and a crack detection unit 800.

Hereinafter, the respective modules will be described with reference to the drawings.

Figure 3:
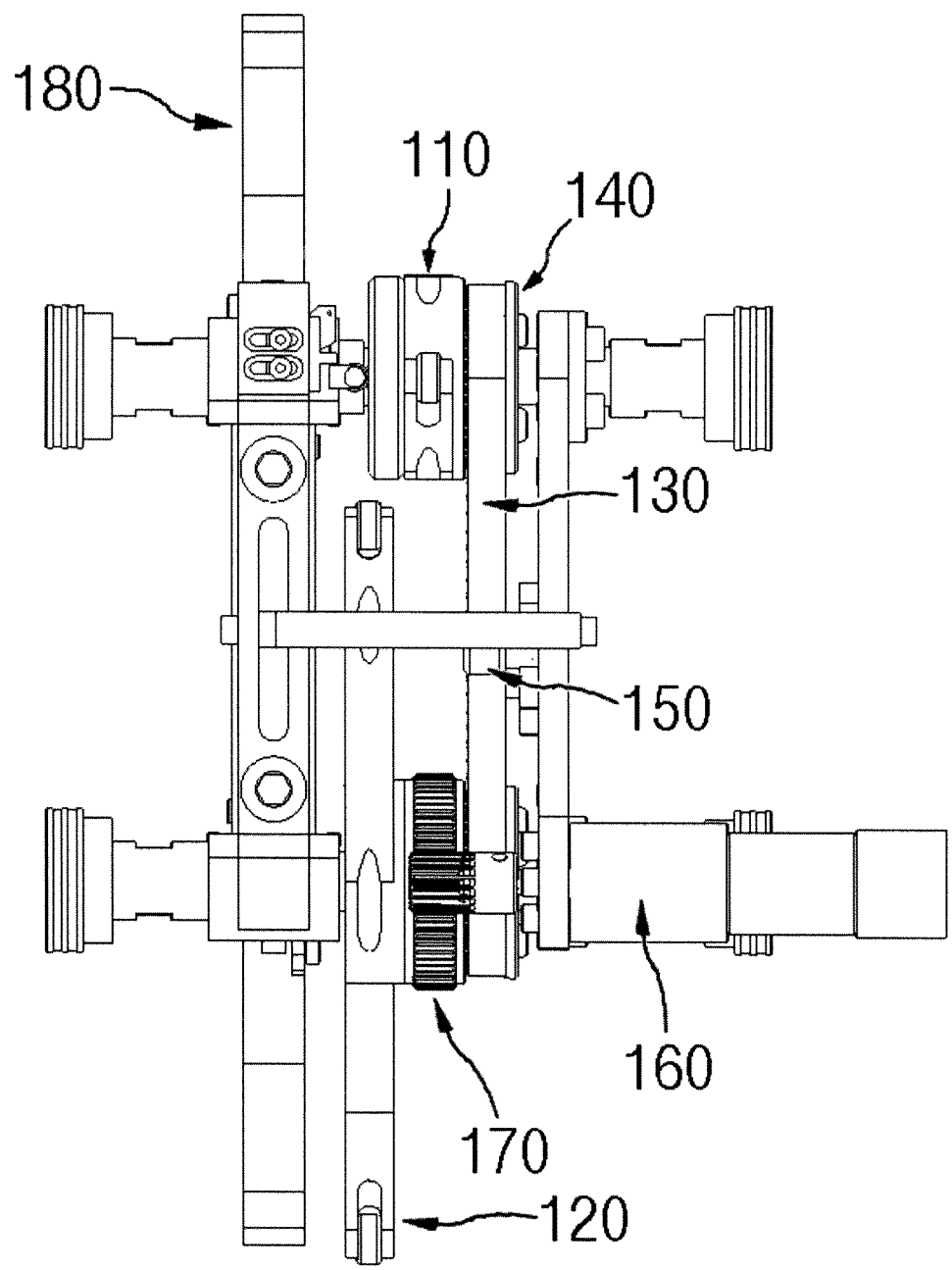
FIG. 3 is a plan view of an actuation module of a robot body shown in FIG. 1.

FIG. 3 is a plan view of the actuation module of the robot body shown in FIG. 1.

Referring to FIG. 3, a single actuation module 100 is provided to each of left, right and central parts of the robot body 1 to ensure stable movement of the robot body 1 along the insulator string. In this embodiment, the robot body 1 includes three actuation modules 100. For stable actuation of the robot body 1, the actuation module 100 may comprise an upper wheel-leg 110, a lower wheel-leg 120, a timing belt 130, a pulley 140, a belt tensioner 150, a DC geared motor 160, a spur gear 170, and a skid bar assembly 180.

The upper wheel-leg 110 protrudes from both sides of the pulley 140, which is actuated by force transferred via the timing belt 130. The belt tensioner 150 is provided to readjust a tension of the timing belt 130.

The lower wheel-leg 120 is coupled to the spur gear 170, which is connected with the DC geared motor 160. Hence, the lower wheel-leg 120 is directly actuated by the DC geared motor 160.

Figure 4:
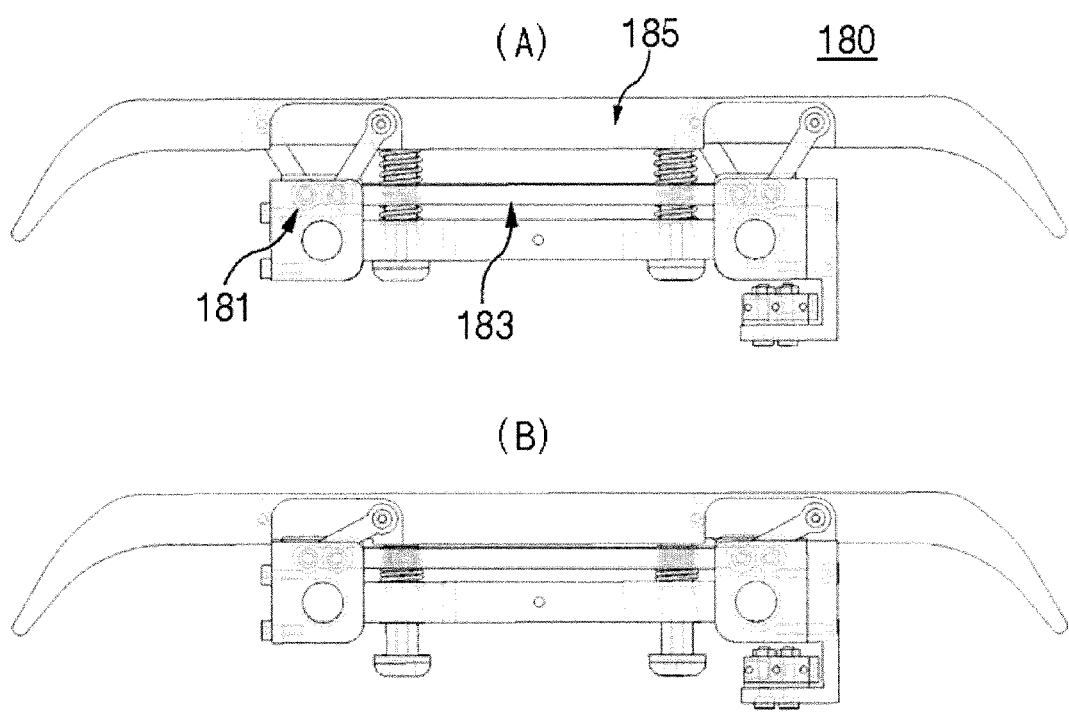
FIG. 4 is side views of a skid bar assembly shown in FIG. 3.

FIG. 4 is side views of the skid bar assembly shown in FIG. 3

In FIG. 4, the skid bar assembly 180 is mounted on the actuation module 100 to prevent the robot body 1 from being separated from the insulator string due to eccentricity of the center of gravity that inevitably occurs due to the structure of the robot body 1.

In order to allow the entirety of a skid bar 185 of the skid bar assembly 180 to be compressed to a constant degree irrespective of a compressed upper part of the skid bar 185, the skid bar assembly 180 has a four-bar linkage structure wherein a base link 183 per se slides as the skid bar 185 is compressed. To form the four-bar linkage structure, links can be coupled to each other via a bearing wheel 181.

Figure 5:
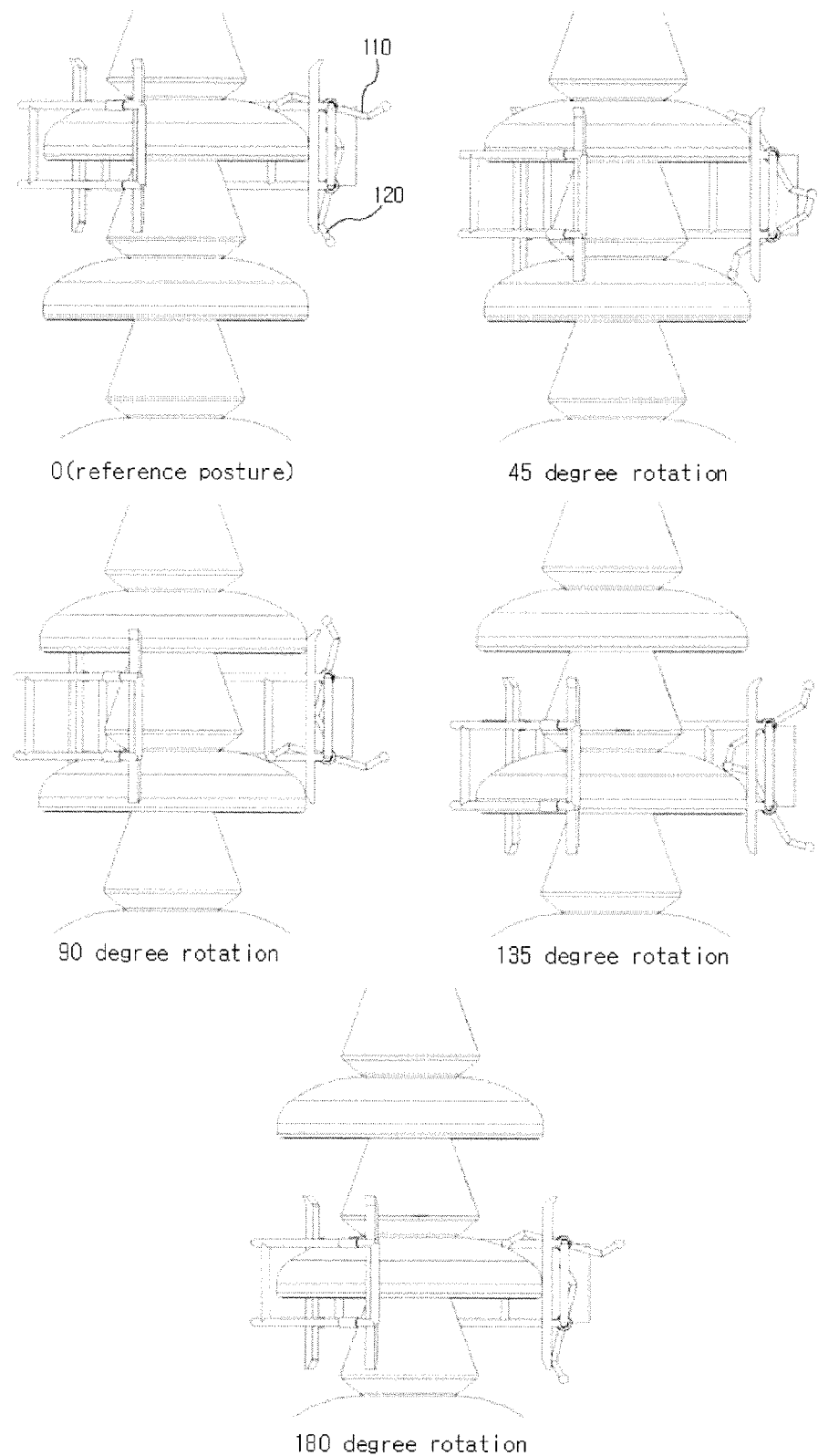
FIG. 5 is a conceptual view illustrating operation of a wheel-leg type mechanism for moving the robot body along a suspension insulator string.

FIG. 5 is a conceptual view illustrating an actuation process of a wheel-leg type mechanism for moving the robot body along the suspension insulator string In FIG. 5, the robot body 1 is lowered a distance corresponding to a single insulator along the insulator string from a reference posture by upper and lower wheel-legs 110 and 120 according to one embodiment of the invention.

The wheel-leg type robot moving mechanism employs the upper and lower wheel-legs 110 and 120 respectively mounted to upper and lower frames that constitute a framework of the robot body 1 for surrounding the insulator, and that serve as rotational shafts of the associated wheel-legs. With this configuration, the upper and lower wheel-legs 110 and 120 move along the insulator string while alternately supporting porcelain parts of the insulators. The upper and lower wheel-legs 110 and 120 can be driven by two motors, respectively. Alternatively, since the upper and lower wheel-legs 110 and 120 are rotated at the same speed, they can be actuated by a single motor via a power transmission device such as a timing belt, which connects the upper and lower wheel-legs 110 and 120 with each other.

The robot body 1 can move from one insulator to another insulator each 180 degree-rotation of the upper and lower wheel-legs 110 and 120. Lifting the robot body along the insulator string is carried out in a reverse sequence to the sequence of lowering the robot body along the insulator string. According to one embodiment of the present invention, the robot body 1 includes three pairs of upper and lower wheel-legs for stable actuation of the robot body 1.

Figure 6:
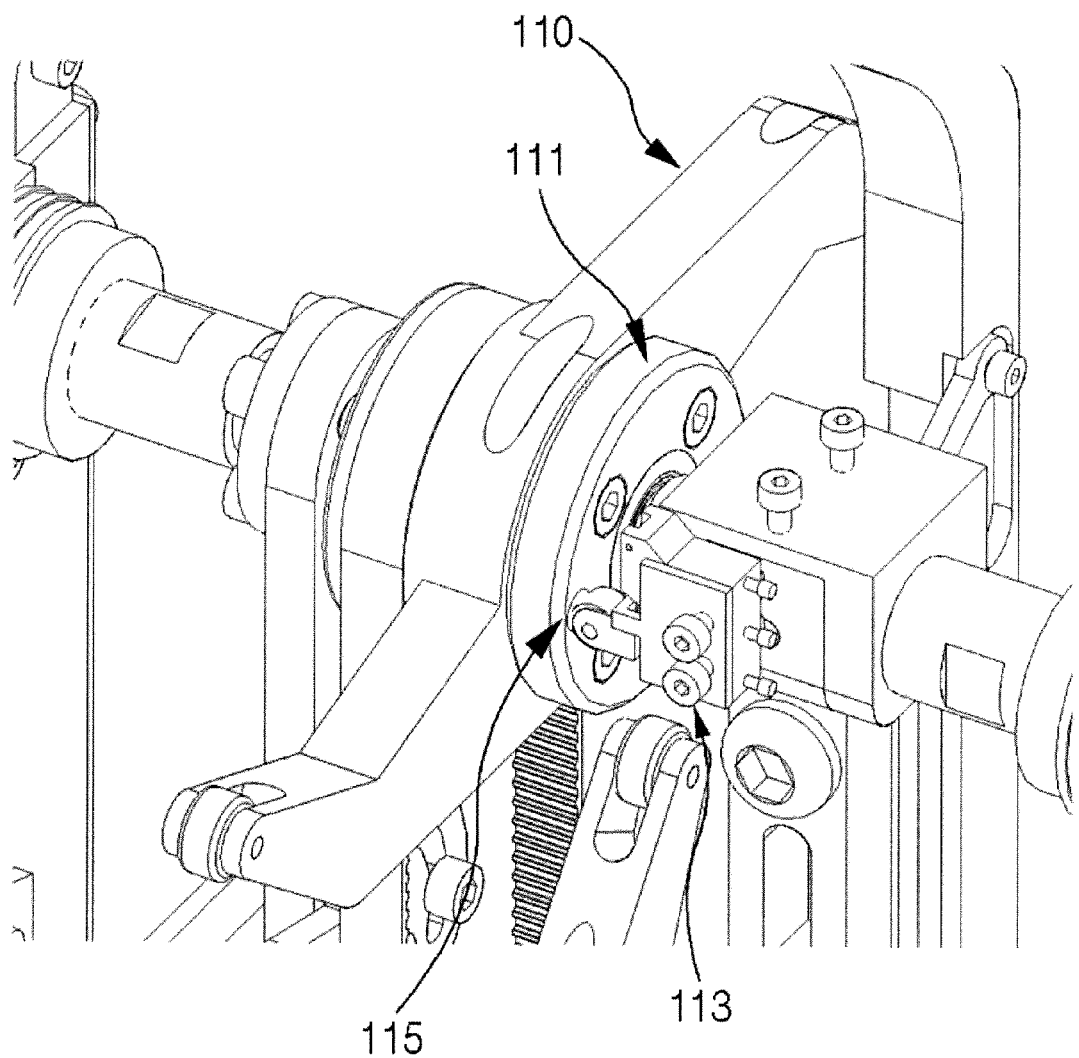
FIG. 6 is a perspective view of a sensor unit mounted on the actuation module for detecting reference postures of upper and lower wheel-legs.

FIG. 6 is a perspective view of a sensor unit mounted on the actuation module for detecting reference postures of upper and lower wheel-legs.

Referring to FIG. 6, in order to determine a current position of the robot body 1 on the insulator string when the robot body 1 moves along the insulator string, it is necessary to find a reference posture of the robot body 1, which indicates that the robot body 1 moves from one insulator to another insulator.

For this purpose, the robot body 1 takes a reference posture as shown in the drawing. Further, the robot body 1 is designed to measure electrical properties of the insulator and to detect cracks thereof in the reference posture.

Therefore, a limit switch 113 may be mounted on the robot body 1 to allow the controller of the robot body 1 to detect the reference posture.

Since the robot body 1 takes the reference posture each 180 degree-rotation of the upper and lower wheel-legs 110 and 120, position detecting pins 115 are provided at an interval of 180 degrees to a rotating plate 111 attached to each of side surfaces of the upper and lower wheel-legs 110 and 120.

The position detecting pins 115 are designed to compress the limit switch 113 in the reference posture.

Figure 7:
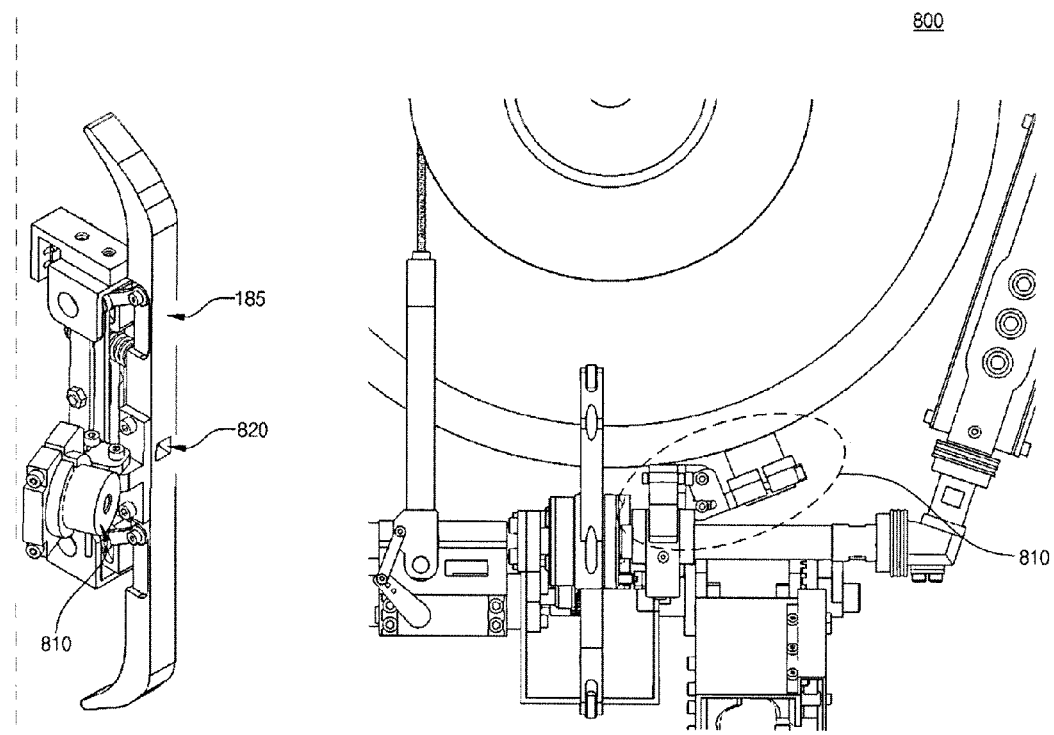
FIG. 7 is a perspective view of an exciter and a vibration measuring sensor of a crack detection unit according to one embodiment of the present invention.

FIG. 7 is a perspective view of an exciter and a vibration measuring sensor of a crack detection unit attached to the central actuation module according to one embodiment of the present invention.

The crack detection unit 800 can detect defects of the insulator by inspecting cracks in the insulator. Thus, the crack detection unit 800 may be mounted to the actuation module 100 which serves to measure the natural frequency of the insulator. Therefore, the crack detection unit 800 may be provided to the actuation module 100 located at the center of the robot body 1 adjacent to the inspection module 200.

The crack detection unit 800 includes an exciter 810 for vibrating the porcelain of the insulator, and a vibration measuring sensor 820.

The exciter 810 is mounted on a side surface of the skid bar 185 to contact one side of the porcelain part of the insulator in the reference posture of the robot body 1, and is designed to allow a horizontal mounting position and angle of the exciter 810 to be adjusted.

The vibration measuring sensor 820 is mounted on a square groove formed at the center of the skid bar 185 in the case where a contact type sensor such as an acceleration sensor is used as the vibration measuring sensor 820. On the other hand, the vibration measuring sensor 820 is mounted on the side surface of the skid bar 185 so as to be located directly above the exciter 810 in the case where a non-contact type sensor such as a microphone is used as the vibration measuring sensor 820.

Figure 8:
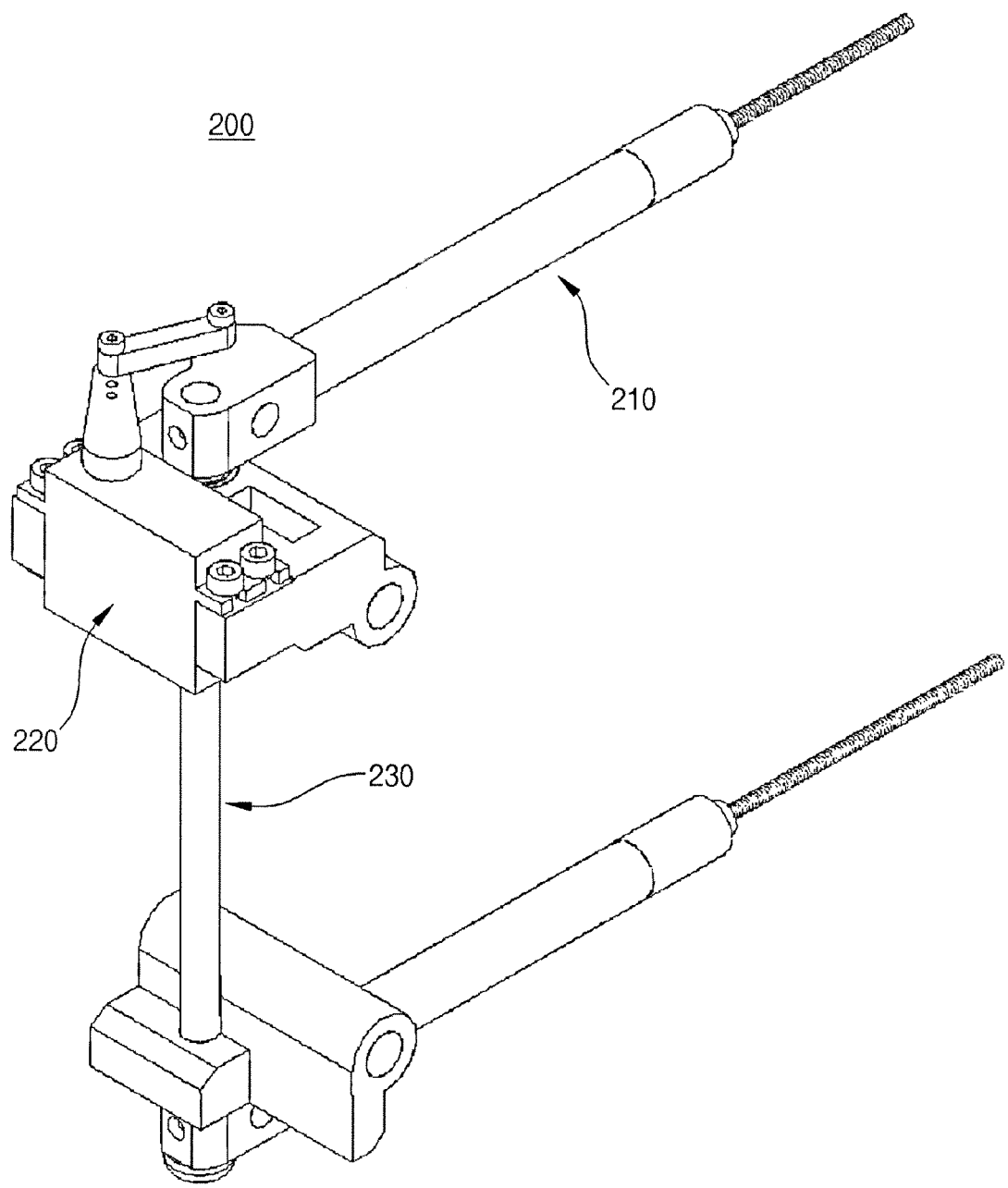
FIG. 8 is a perspective view of an inspection module for electrically inspecting insulators.

FIG. 8 is a perspective view of the inspection module for electrically inspecting the insulator.

Referring to FIG. 8, the inspection module can electrically inspect the insulator.

For electrical inspection of a live-line insulator, the inspection module 200 of the robot body 1 includes a rotational shaft 230 driven by an RC servo motor 220, and two detection rods 210 mounted on the rotational shaft 230. By rotating the rotational shaft 230, the detection rods 210 are brought into contact with a cap of the live-line insulator to measure the electrical properties of the live-line insulator.

Figure 9:
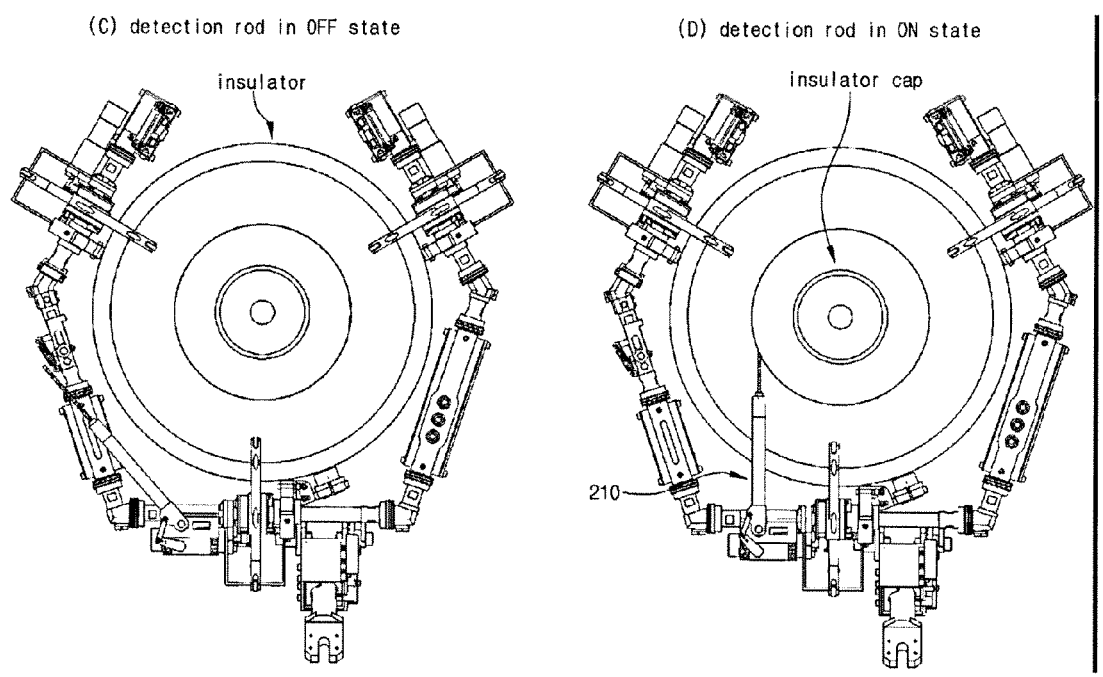
FIG. 9 is top views illustrating operating and non-operating states of detection rods of the inspection module shown in FIG. 8.

FIG. 9 is top views illustrating an operating state of the detection rods shown in FIG. 7.

Referring to FIG. 9, in an off-state as shown in (C), the detection rods 210 are located outside the insulator.

However, in an on-state as shown in (D), the detection rods 210 contact the insulator to perform detection of the electrical properties.

Figure 10:
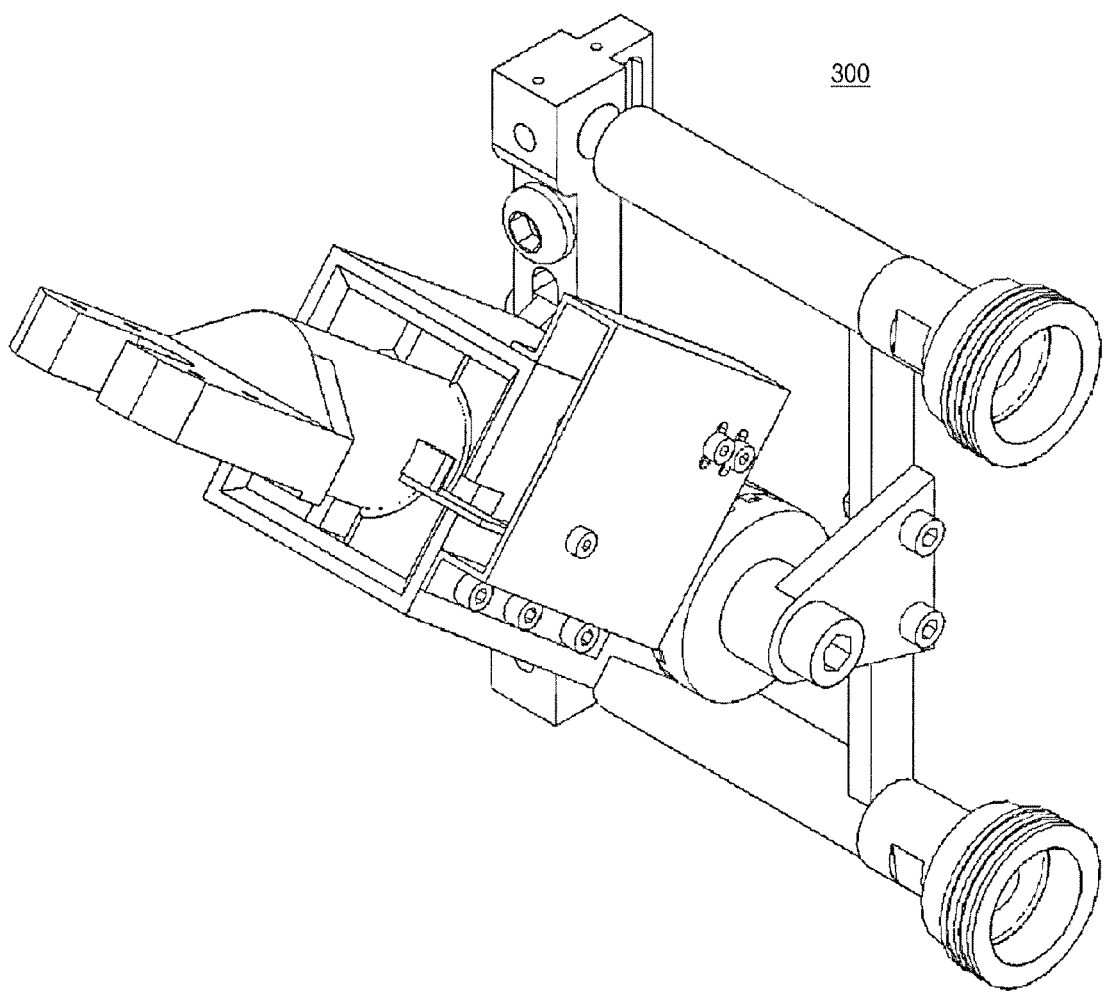
FIG. 10 is a perspective view of a connection module according to one embodiment of the present invention.
Figure 11:
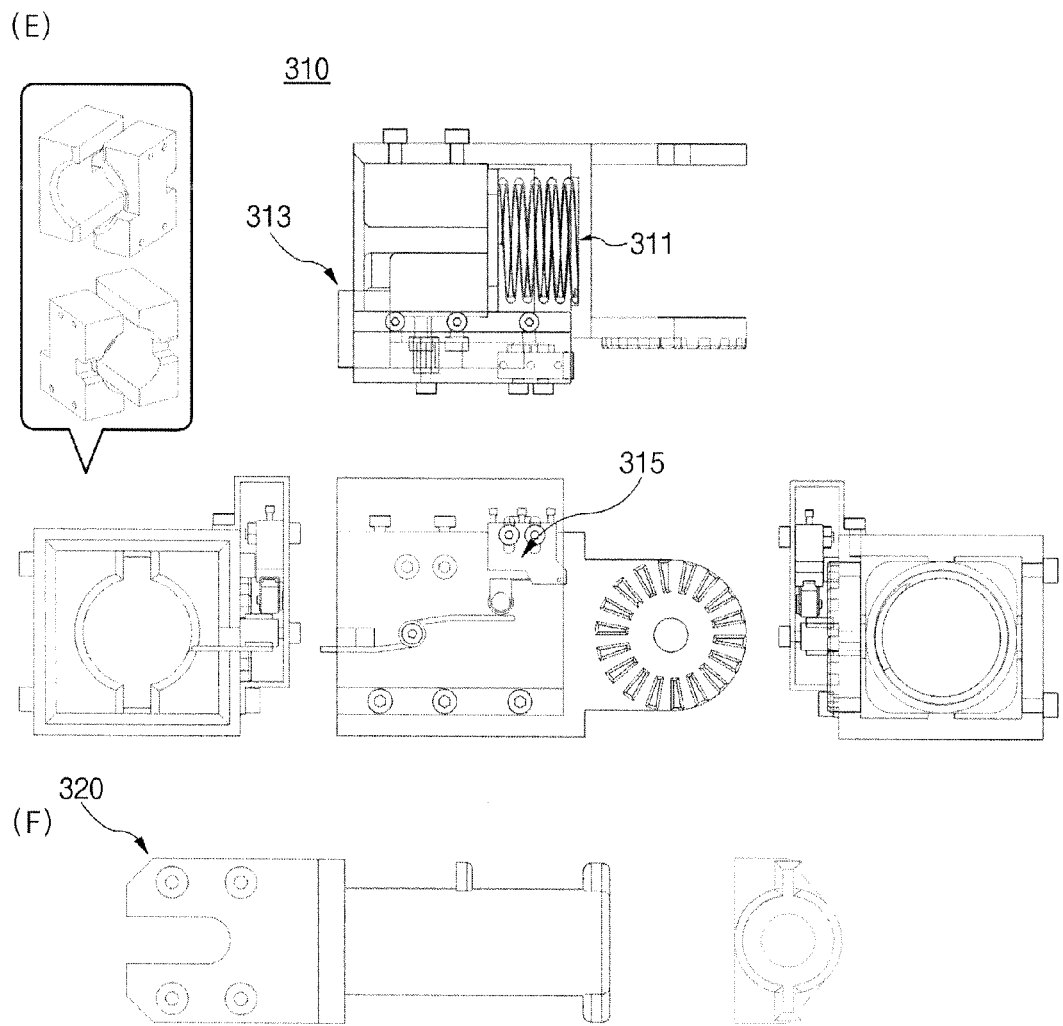
FIG. 11 is exploded views of the connection module of FIG. 10.

FIG. 10 is a perspective view of a connection module according to one embodiment of the present invention, and FIG. 11 is exploded views of the connection module shown in FIG. 10.

Referring to FIGS. 10 and 11, the connection module 300 connects the robot body 1 with an installation/dismantlement mechanism (not shown) used for installing or dismantling the robot body 1 with respect to the insulator string. Hence, the connection module 300 is used for installing or dismantling the robot body 1 with respect to the insulator string.

In FIG. 11, (E) shows the robot body 1 constituting the connection module 300, and (F) shows a component of an insulation rod for the installation/dismantlement mechanism.

The connection module 300 may include a key part 320 of a key shape corresponding to the insulation rod and a keyhole assembly 310 of a keyhole shape.

In locking operation of the connection module 300, the key part 320 of the connection module 300 is forcibly pushed into a hole of the keyhole assembly 310, and a spring 311 is then pushed out of the keyhole assembly 310, thereby forming a space in the keyhole assembly 310 where the key part 320 can be rotated. At this time, after the key part 320 is rotated 90 degrees clockwise, the force applied to the key part 320 is released, so that the key part 320 can be pushed by the force of the spring 311 and locked into a groove. Then, when the key part 320 is rotated 90 degrees clockwise, a lever 313 is compressed to push a second limit switch 315. Unlocking operation is performed in a reverse sequence to that for locking the key part 320.

Figure 12:
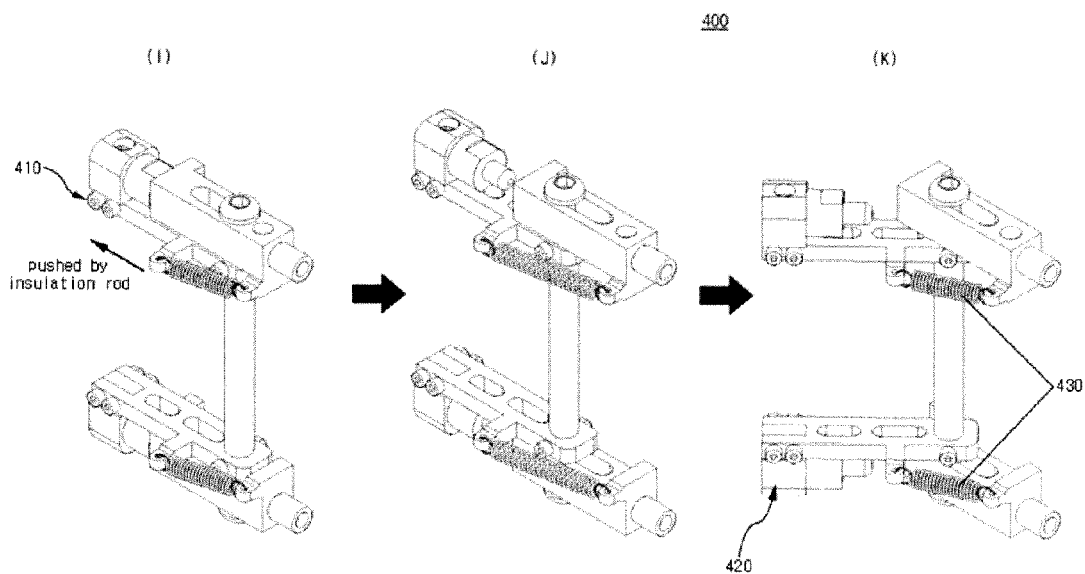
FIG. 12 shows operation of a wing opening/closing module for separating the robot body from the insulator string.
Figure 13:
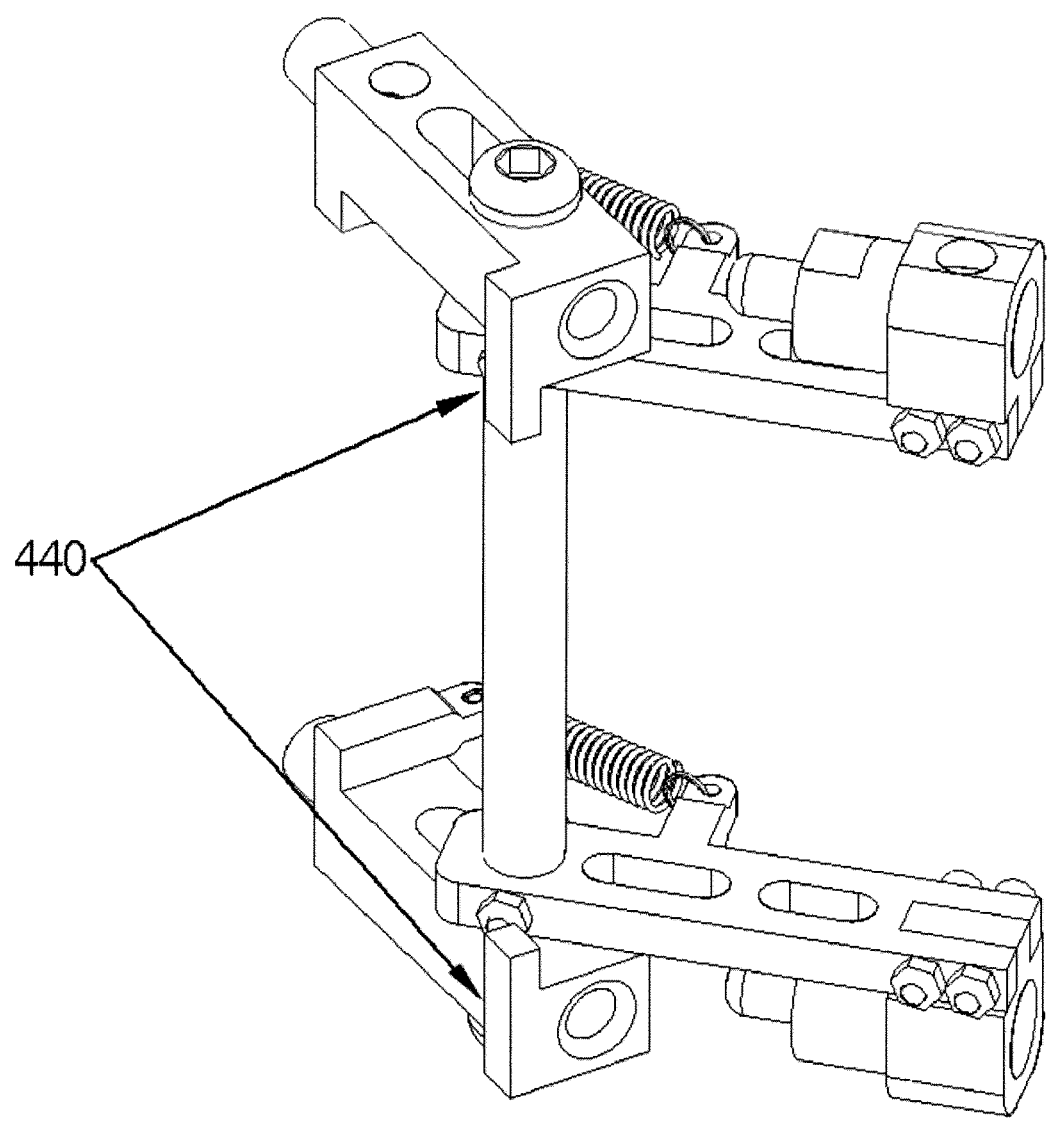
FIG. 13 is a perspective view of a frame protrusion for preventing the wing opening/closing module from being opened inwardly.

FIG. 12 shows operation of a wing opening/closing module for separating the robot body from the insulator string, and FIG. 13 is a perspective view of a frame protrusion for preventing the wing opening/closing module from being opened inwardly.

Referring to FIGS. 12 and 13, the wing opening/closing module 400 can manually separate the robot body 1 from the insulator string by means of an insulation rod 420 when the robot body 1 malfunctions or suffers problems in actuation.

In operation of the wing opening/closing module 400, after holding a part of the frame of the robot body 1 with an insulation rod 410 having a ring attached to a distal end of the insulation rod 410, a left-side skid bar of the wing opening/closing module 400 disposed on the left-side actuation module 100 is pushed as shown in (I) of FIG. 12 by another insulation rod 420 which also has a ring attached the distal end thereof. Then, a part of the wing opening/closing module where the left-side actuation module is mounted is opened outwardly as shown in (K) of FIG. 12 by restoration of the extended spring 430.

The frame protrusion 440 is provided to prevent the wing opening/closing module 400 from being opened inwardly.

Figure 14:
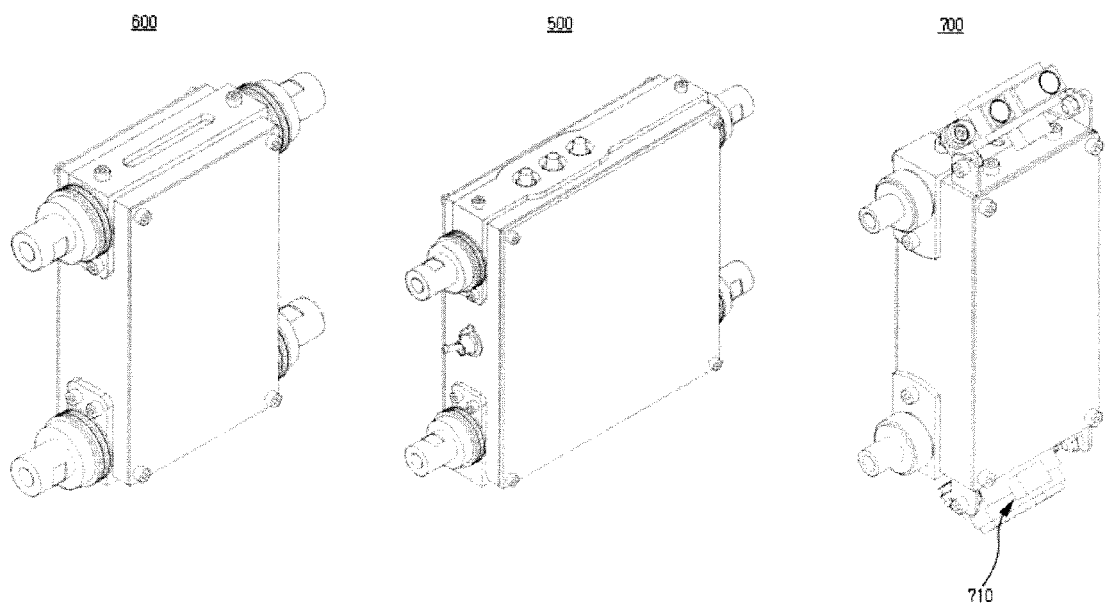
FIG. 14 is perspective views of a controller, a measurement module, and a battery module.
Figure 15:
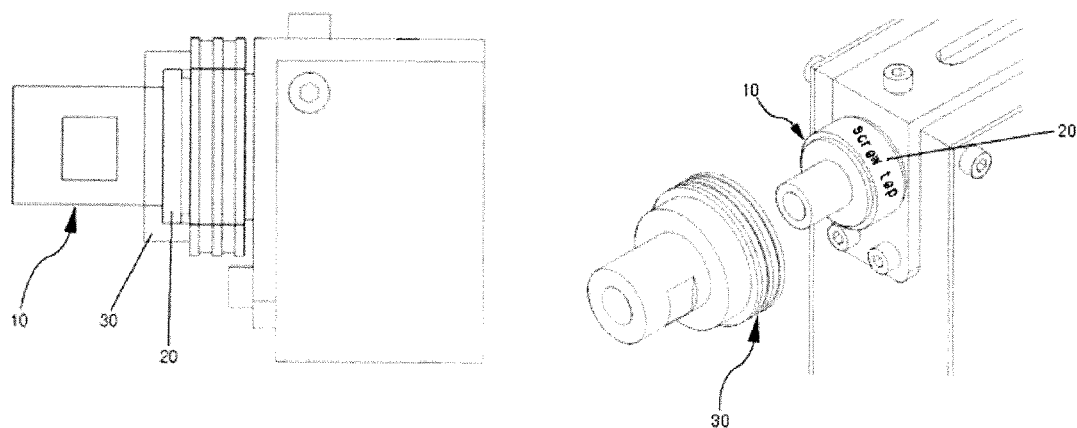
FIG. 15 shows a connecting structure of each of the modules connecting with each other.

FIG. 14 is perspective views of the controller, the measurement module, and the battery module, and FIG. 15 shows a connecting structure of each of the modules connecting with each other.

In FIGS. 14 and 15, the controller can control the operation of the robot body 1.

The measurement module 500 may be configured to measure the electrical properties of the insulator. The measurement module 500 can measure insulation resistance and assigned voltage of the insulator.

The battery module 700 supplies electric power to the robot body 1. Further, the battery module 700 is provided at upper and lower parts thereof with distance measuring sensors 710 to detect whether any insulator is present at the upper and lower parts of the robot body 1. Through such detection, it can be determined whether the robot body 1 moving along the insulator string reaches the uppermost or lowermost part of the suspension insulator string.

To ensure easy coupling between the respective modules, each connecting structure between the modules includes a cylindrical connecting part 10 having a screw tap 20 on an outer surface of the connecting part 10, and a cylindrical cap 30 having a screw tap on an inner surface of the cylindrical cap 30. That is, by rotating the cylindrical cap 30 after the cylindrical connecting part 10 is inserted into the cylindrical cap 30, the cylindrical cap 30 is locked to the cylindrical connecting part 10. This connecting structure enables modulation of the overall robot body 1, providing various merits in terms of maintenance and repair.

Figure 16:
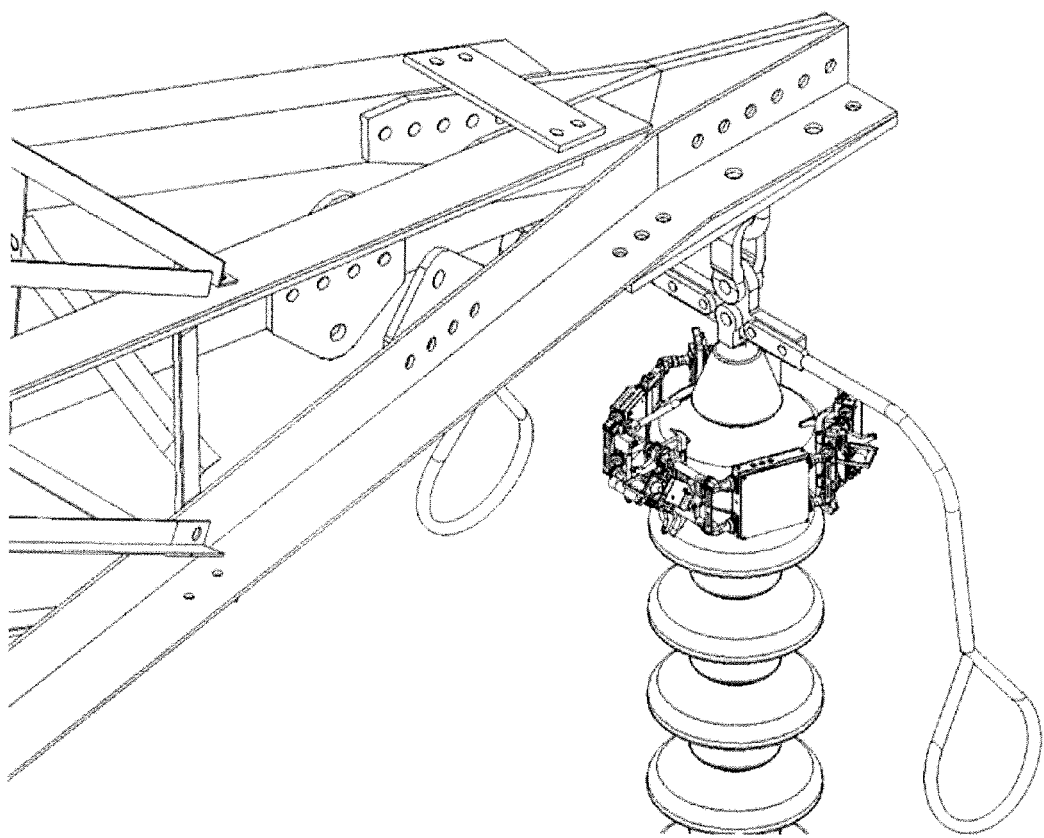
FIG. 16 is a view illustrating the robot body according to the embodiment of the present invention applied to a suspension insulator string of an iron tower.

FIG. 16 is a view illustrating the robot body according to the embodiment of the present invention applied to a suspension insulator string of an iron tower.

Figure 17:
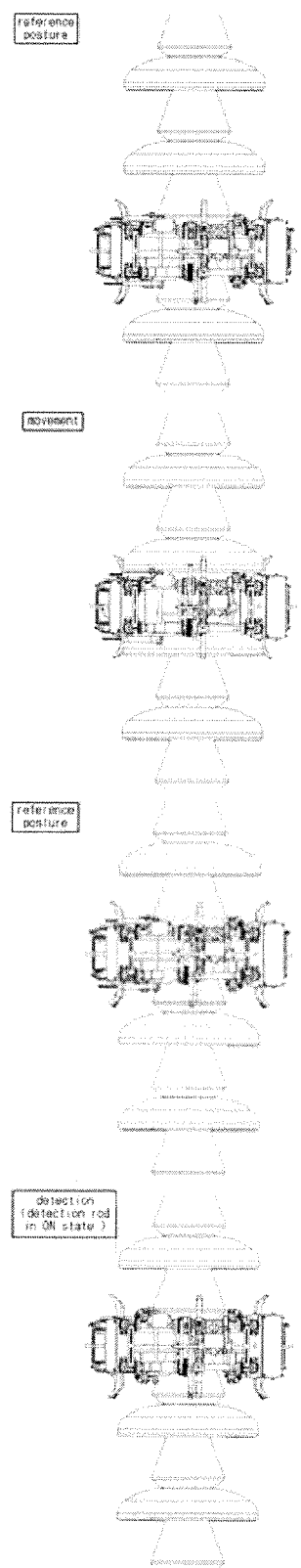
FIG. 17 is pictures showing movement and inspecting operations of the robot mechanism according to the embodiment of the present invention.

FIG. 17 is pictures showing movement and inspecting operations of the robot mechanism according to the embodiment of the present invention.

Referring to FIG. 17, the robot body 1 is initially in a reference posture on a suspension insulator string. Then, the robot body 1 moves to an upper-side insulator by means of the upper and lower wheel-legs 110 and 120, and takes again the reference posture to inspect the upper-side insulator.

Figure 18:
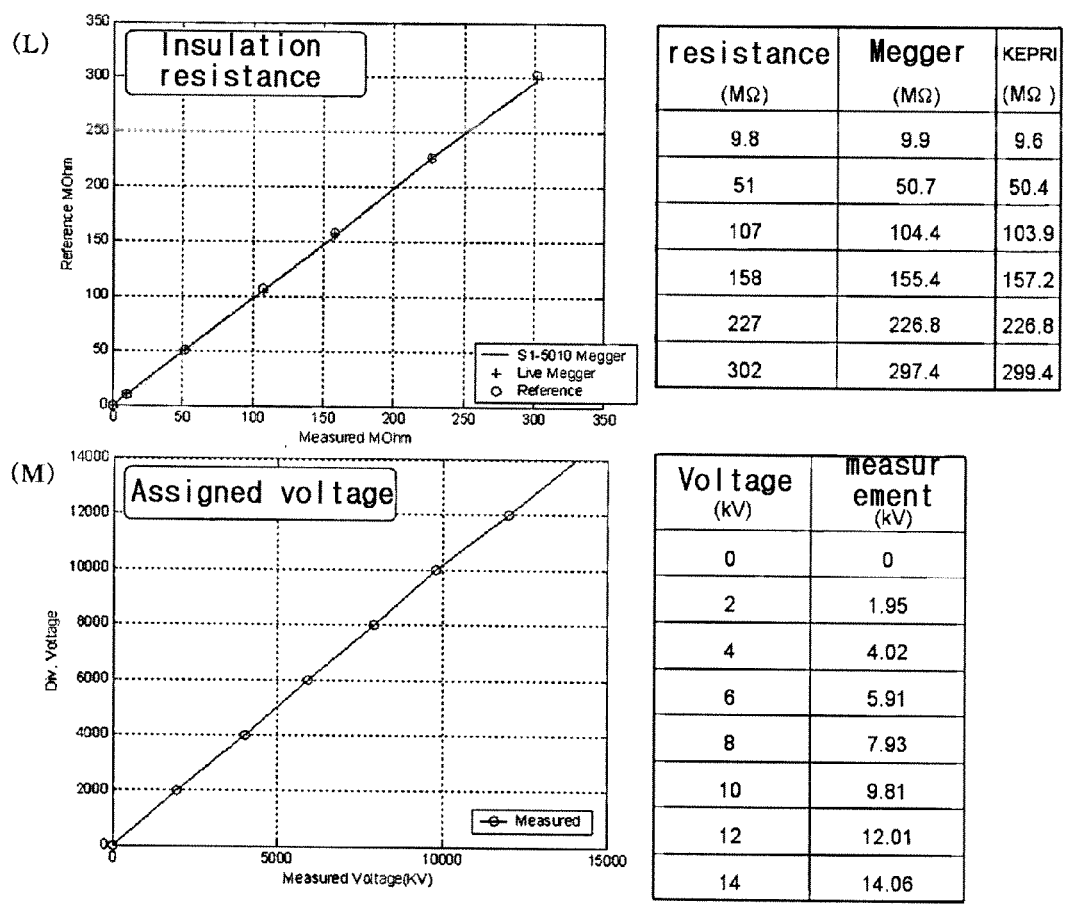
FIG. 18 is graphs depicting results of measuring insulation resistance and assigned voltage of an insulator with the robot body according to the embodiment of the present invention.

FIG. 18 is graphs depicting results of measuring insulation resistance and assigned voltage of an insulator with the robot body according to the embodiment of the invention.

In FIG. 18, for tests to confirm whether the inspection module 200 normally measures the insulation resistances of insulators, reference resistances of 9.8 MΩ, 51 MΩ, 107 MΩ, 158 MΩ, 227 MΩ, and 302 MΩ were connected in parallel between two insulator caps of an insulator string and measured by the robot body according to the embodiment of this invention. Further, in this test, the insulation resistances of insulator specimens were measured by AVO MEGGER S1-5010, and were compared with the resistances measured by the robot body.

In FIG. 18, Graph (L) depicts test results of measuring the insulation resistances of the insulators with the inventive robot body and S1-5010. From the test results based on six reference resistances from 9.8 MΩ to 302 MΩ, it could be confirmed that both the inventive robot body and S1-5010 performed substantially precise measurement of the resistances.

Next, for tests to confirm whether the inspection module 200 normally measures the assigned voltages of the insulators, the voltages of the insulators were measured by the robot body of the embodiment of the invention while changing the assigned voltages from 0 kV to 14 kV.

In FIG. 18, Graph (M) depicts test results of measuring the assigned voltages of the insulators with the inventive robot body. From the test results, it could be confirmed that the inventive robot body performed substantially precise measurement of the assigned voltages of the insulators.

Figure 19:
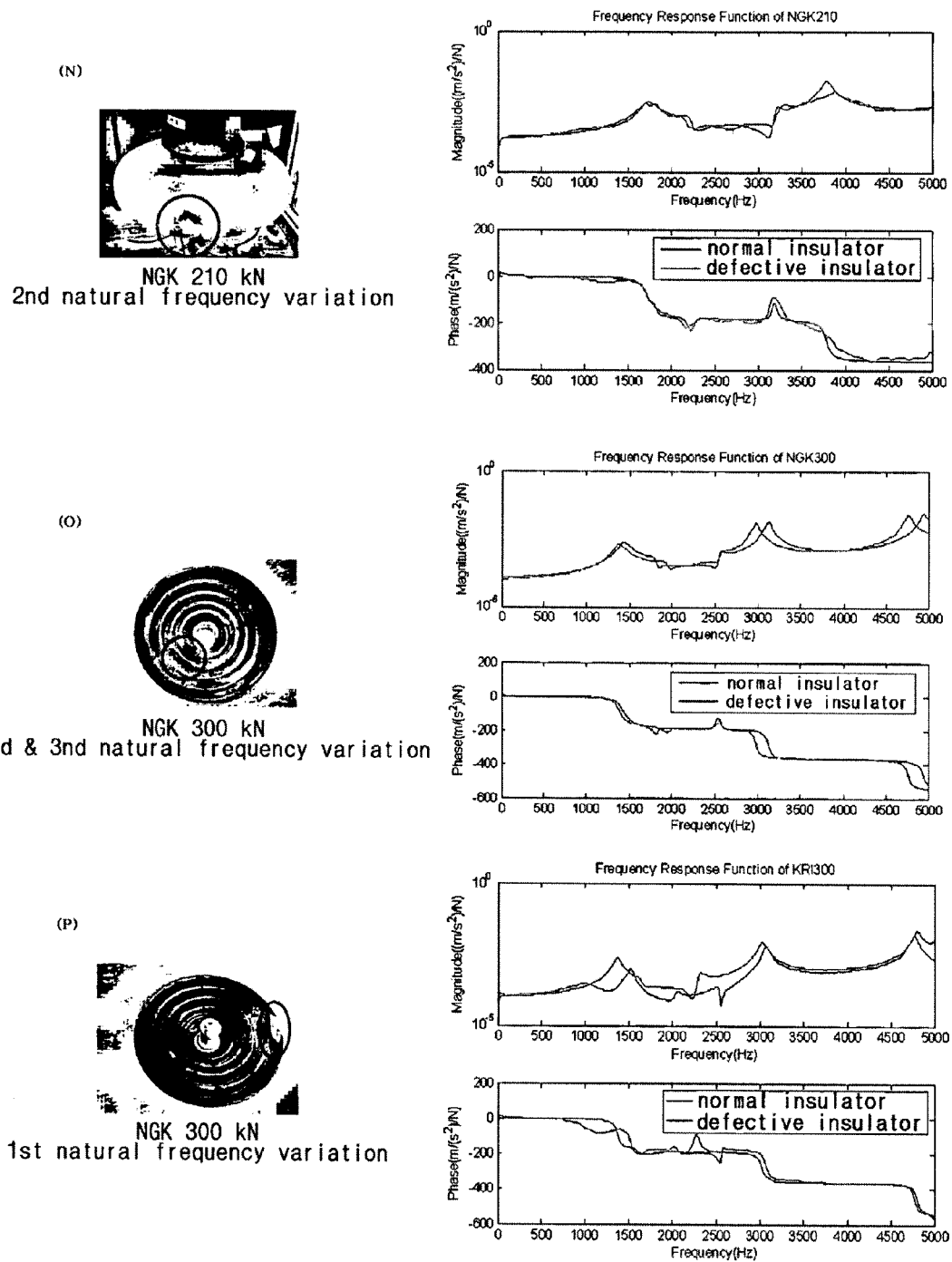
FIG. 19 shows test results of detecting cracks on an insulator with the robot body according to the embodiment of the present invention, in which the cracks are caused by breakage on a porcelain part of the insulator.

FIG. 19 shows test results of detecting cracks on an insulator with the robot body according to the embodiment of the present invention, in which the cracks are caused by breakage of a porcelain part of the insulator.

Referring to FIG. 19, the robot body of the present invention can detect cracks on an insulator using the inspection module to inspect defects of the insulator, in addition to measurement of the electrical properties of the insulator. While generating vibration on the porcelain part of the insulator by the exciter, the robot body measures the vibration via the contact type sensor such as the acceleration sensor or via the non-contact type sensor such as the microphone. Then, after obtaining the natural frequency of a target insulator through frequency response analysis of this vibration, the natural frequency of the target insulator is compared with that of a normal insulator to determine whether a porcelain part of the target insulator has cracks.

In FIG. 19, (N), (O) and (P) show test results of detecting the cracks with the robot mechanism of the present invention with respect to NGK 210 kN, NGK 300 kN, and Korean Insulator 300 kN, respectively. The results show that the cracks on the insulators were successfully detected by the robot body of the robot mechanism according to this invention.

In other words, it can be confirmed from the test results that the natural frequency of an insulator having a crack on a porcelain part thereof is different from that of a normal insulator and tended to change according to a broken position and size of the insulator.

As apparent from the above description, the robot mechanism for inspection of a live-line suspension insulator string according to the invention contacts a single insulator during movement, so that it can ensure very good insulating properties and has a very simple structure compared with those of the conventional inspection mechanism, which contacts two or more insulators when moving along the insulator string. Therefore, the robot mechanism of the present invention can be reduced in size and weight as compared with the conventional mechanism, thereby improving reliability and efficiency in insulator inspection.

Further, the robot mechanism of the invention can measure two or more electrical properties of an insulator for defect inspection, and can detect cracks in a porcelain part of the insulator, so that interruption of electric power caused by a defective insulator and economic loss relating to the interruption of electric power can be prevented.

Although the present invention has been described with reference to the embodiments and the accompanying drawings, it will be apparent to those skilled in the art that the embodiments are given by way of illustration, and that various modifications and equivalent embodiments can be made without departing from the spirit and scope of the present invention as defined by the following claims.

What is claimed is:

1. A robot mechanism for inspection of a live-line suspension insulator string, including a robot body reciprocating along the live-line suspension insulator string, wherein the robot body comprises:
   upper and lower robot frames configured to encircle the insulator string;
   a battery module provided to either end of the robot body;
   an actuation module for moving the robot body along the insulator string;
   an inspection module for electrically inspecting an insulator;
   a connection module for coupling the robot body to an installation/dismantlement mechanism;
   a wing opening/closing module for manually separating the robot body from the insulator string;
   a measurement module for measuring electrical properties of the insulator;
   a controller for controlling operation of the robot body; and
   a crack detection unit for detecting cracks formed in the insulator.

2. The robot mechanism according to claim 1, wherein the robot body further includes a skid-bar assembly to prevent the robot body from being separated from the insulator string.

3. The robot mechanism according to claim 1, wherein the robot body comprises at least three actuation modules for stable actuation of the robot body.

4. The robot mechanism according to claim 3, wherein each of the actuation modules comprises a limit switch to detect a shifted position of the robot body.

5. The robot mechanism according to claim 1, wherein the robot body moves along the insulator string while alternately supporting porcelain parts of insulators via rotation of wheel-legs of the actuation module.

6. The robot mechanism according to claim 1, wherein the crack detection unit comprises an exciter and a vibration measuring sensor.

7. The robot mechanism according to claim 1, wherein the inspection module comprises at least one detection rod.

8. The robot mechanism according to claim 1, wherein the battery module comprises a distance measuring sensor for detecting movement of the robot body.

* * * * *